United States Patent
Bhagavatula et al.

(10) Patent No.: US 9,667,228 B2
(45) Date of Patent: May 30, 2017

(54) APPARATUS FOR AND METHOD OF PROGRAMMABLE MATCHING NETWORK FOR MULTIPLE SIGNAL TYPES

(71) Applicant: Samsung Electronics Co., Ltd., Gyeonggi-do (KR)

(72) Inventors: Venumadhav Bhagavatula, Santa Clara, CA (US); Sriramkumar Venugopalan, Campbell, CA (US); Siddharth Seth, Campbell, CA (US); Siuchuang Ivan Lu, San Jose, CA (US); Sang Won Son, Palo Alto, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/065,433

(22) Filed: Mar. 9, 2016

(65) Prior Publication Data
US 2017/0077904 A1    Mar. 16, 2017

Related U.S. Application Data

(60) Provisional application No. 62/218,157, filed on Sep. 14, 2015.

(51) Int. Cl.
*H03H 7/40*     (2006.01)
*H03H 11/28*    (2006.01)
(Continued)

(52) U.S. Cl.
CPC ............ *H03H 11/28* (2013.01); *H03D 7/125* (2013.01); *H03H 11/32* (2013.01); *H03K 17/691* (2013.01); *H03K 17/693* (2013.01)

(58) Field of Classification Search
CPC ........ H03H 11/28; H03H 11/32; H03D 7/125; H03K 12/691; H03K 17/693
(Continued)

(56) References Cited

U.S. PATENT DOCUMENTS 6,806,836 B2 * 10/2004 Ogawa .................... H01Q 1/242
343/702
7,447,272 B2    11/2008 Haglan
(Continued)

OTHER PUBLICATIONS

Yumi Lee et al., A Dual-Power-Mode Output Matching Network for Digitally Modulated CMOS Power Amplifier, Cited by: Papers (2)IEEE Journals & Magazines.
(Continued)

*Primary Examiner* — Dinh T Le
(74) *Attorney, Agent, or Firm* — The Farrell Law Firm, P.C.

(57) ABSTRACT

An apparatus and method are provided. The apparatus includes a multiplexer, including a first input, a second input, a third input, and an output; a first transistor, including a gate, a first terminal, and a second terminal; a first variable capacitor, including a first terminal, a second terminal, and an input; a first inductor, including a first terminal and a second terminal; a second transistor, including a gate, a first terminal, and a second terminal; a second inductor mutually coupled to the first inductor, including a first terminal and a second terminal; a balun-bias switch, including a first input, a second input, a third input, and an output; a second capacitor, including a first terminal, and a second terminal; and a port-switch, including a first input, a second input, a third input, and an output.

20 Claims, 9 Drawing Sheets

(51) Int. Cl.
*H03H 11/32* (2006.01)
*H03K 17/691* (2006.01)
*H03K 17/693* (2006.01)
*H03D 7/12* (2006.01)

(58) Field of Classification Search
USPC ............... 327/357; 333/17.1, 17.3; 455/107; 343/860, 861
See application file for complete search history.

(56) References Cited

U.S. PATENT DOCUMENTS

| | | | |
|---|---|---|---|
| 7,532,679 B2 | 5/2009 | Staszewski et al. | |
| 7,567,129 B2 | 7/2009 | Rohani et al. | |
| 7,831,219 B2 * | 11/2010 | Heuermann | H03H 7/40 327/74 |
| 8,081,935 B2 | 12/2011 | Liang et al. | |
| 8,095,093 B2 | 1/2012 | Takinami et al. | |
| 8,489,046 B2 | 7/2013 | Liang et al. | |
| 8,964,881 B2 | 2/2015 | Goswami | |
| 9,071,204 B2 | 6/2015 | Pamarti et al. | |
| 9,172,355 B2 * | 10/2015 | Sato | H03H 11/348 |
| 9,287,827 B2 * | 3/2016 | Gopalan | H03D 3/00 |
| 2007/0085754 A1 | 4/2007 | Ella et al. | |
| 2009/0116510 A1 | 5/2009 | Georgantas et al. | |
| 2011/0129037 A1 | 6/2011 | Staszewski et al. | |
| 2014/0176388 A1 * | 6/2014 | Van Liempd | H01Q 1/50 343/861 |
| 2015/0171800 A1 | 6/2015 | Hadjichristos et al. | |

OTHER PUBLICATIONS

Microwave Theory and Techniques, IEEE Transactions on Year: 2013, vol. 61, Issue: 4 pp. 1570-1579, DOI: 10.1109/TMTT.2013.2246525.

* cited by examiner

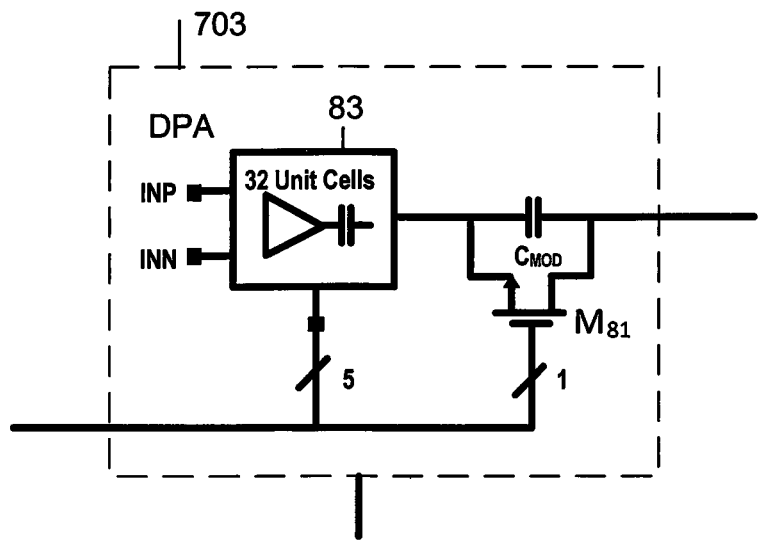
FIG. 8
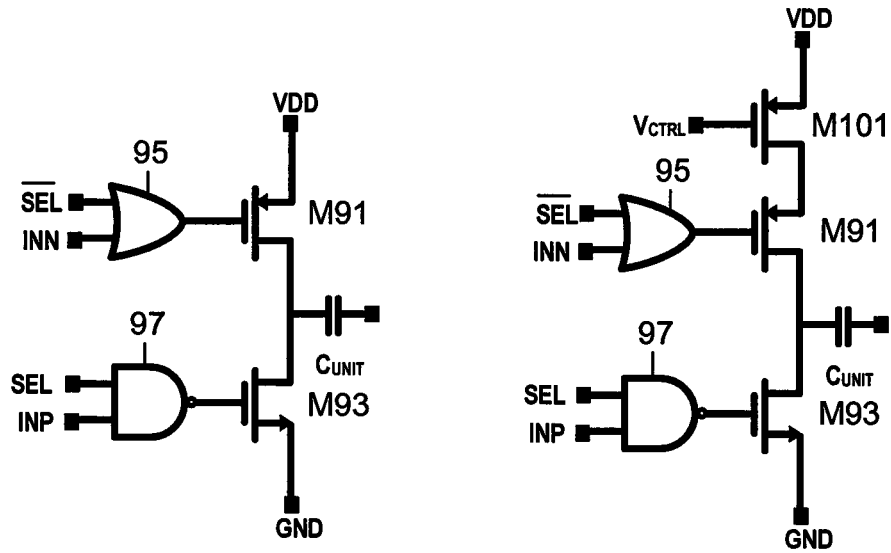
FIG. 9                    FIG. 10

APPARATUS FOR AND METHOD OF PROGRAMMABLE MATCHING NETWORK FOR MULTIPLE SIGNAL TYPES

PRIORITY

This application claims priority under 35 U.S.C. §119(e) to a U.S. Provisional Patent Application filed on Sep. 14, 2015 in the United States Patent and Trademark Office and assigned Ser. No. 62/218,157, the entire contents of which are incorporated herein by reference.

FIELD

The present disclosure relates generally to an apparatus for and a method of a programmable matching network for multiple signal types, and more particularly, to an apparatus for and a method of a programmable matching network for multiple signal types, where each programmed matching network is optimized for a different wireless communication standard.

BACKGROUND

Electrical and system specifications or standards for 2G, 3G, and 4G wireless communication networks are significantly different. The performance and power consumption of different wireless communication networks may be optimized by using a dedicated transmitter for each wireless communication standard. However, using multiple dedicated transmitters increases the area of an integrated circuit (IC) or chip due to the requirement for a different matching network for each transmitter.

SUMMARY

An apparatus is provided. The apparatus includes a multiplexer, including a first input for receiving a ground potential, a second input for receiving a bias voltage, a third input for receiving an enable signal, and an output for selecting one of the ground potential and the bias voltage based on the enable signal; a first transistor, including a gate, a first terminal, and a second terminal, wherein the gate of the first transistor is connected to the output of the first multiplexer, and wherein the first terminal of the first transistor receives a first differential modulated signal; a first variable capacitor, including a first terminal, a second terminal, and an input, wherein the first terminal of the first variable capacitor is connected to the second terminal of the first transistor, and wherein the input of the first variable capacitor is configured to set a capacitance value of the first variable capacitor; a first inductor, including a first terminal and a second terminal, wherein the first terminal of the first inductor is connected to the second terminal of the first transistor, and wherein the second terminal of the first inductor is connected to the second terminal of the first variable capacitor; a second transistor, including a gate, a first terminal, and a second terminal, wherein the gate of the second transistor is connected to the output of the first multiplexer, wherein the first terminal of the second transistor receives a second differential modulated signal, and wherein the second terminal of the second transistor is connected to the second terminal of the first inductor; a second inductor mutually coupled to the first inductor, including a first terminal and a second terminal; a balun-bias switch, including a first input for receiving the ground potential, a second input for receiving a power supply voltage, a third input for receiving an inverse of the enable signal, and an output, wherein the output of the balun-bias switch is connected to the second terminal of the second inductor; a second capacitor, including a first terminal, and a second terminal for receiving a polar signal, wherein the first terminal of the second capacitor is connected to the first terminal of the second inductor; and a port-switch, including a first input for receiving the enable signal, a second input for receiving the inverse of the enable signal, a third input, and an output, wherein the third input of the port-switch is connected to the first terminal of the second inductor.

An apparatus is provided. The apparatus includes a multiplexer, including a first input for receiving a ground potential, a second input for receiving a bias voltage, a third input for receiving an enable signal, and an output for selecting one of the ground potential and the bias voltage based on the enable signal; a first transistor, including a gate, a first terminal for receiving a first differential modulated signal, and an output, wherein the gate of the first transistor is connected to the output of the multiplexer; a first variable capacitor, including a first terminal, a second terminal, and an input configured to set a capacitance value of the first variable capacitor, wherein the first terminal of the first variable capacitor is connected to the second terminal of the first transistor; a first inductor, including a first terminal, and a second terminal, wherein the first terminal of the first inductor is connected to the second terminal of the first transistor, and wherein the second terminal of the first inductor is connected to the second terminal of the first variable capacitor; a second transistor, including a gate, a first terminal for receiving a second differential modulated signal, and a second terminal, wherein the gate of the second transistor is connected to the output of the multiplexer, and wherein the second terminal of the second transistor is connected to the second terminal of the first inductor; a second inductor mutually coupled to the first inductor, including a first terminal and a second terminal; a balun-bias switch, including a first input for receiving the ground potential, a second input for receiving a power supply voltage, a third input for receiving an inverse of the enable signal, and an output, wherein the output of the balun-bias switch is connected to the second terminal of the second inductor; a ramp generator, including an input and an output bus, wherein the input controls the ramp generator to provide a predetermined ramp function at an output bus; a digital power amplifier (DPA), including an input bus, a control bus for receiving all of the control signals necessary to operate the DPA, and an output, wherein the input bus of the DPA is connected to the output bus of the ramp generator, and wherein the output of the DPA is connected to the first terminal of the second inductor; and a port-switch, including a first input for receiving the enable signal, a second input for receiving the inverse of the enable signal, a third input, wherein the third input of the port-switch is connected to the first terminal of the second inductor, and an output.

A method is provided. The method includes multiplexing, by a multiplexer, a ground potential and a bias voltage, wherein the first multiplexer includes a first input for receiving the ground potential, a second input for receiving the bias voltage, a third input for receiving an enable signal, and an output; transmitting, by a first transistor, a first differential modulated signal to a first inductor, wherein the first transistor includes a gate, a first terminal for receiving the first differential modulated signal, and a second terminal, and wherein the first inductor includes a first terminal and a second terminal, wherein the gate of the first transistor is connected to the output of the multiplexer, and wherein the first terminal of the first inductor is connected to the second terminal of the first transistor; setting a capacitance value, by a first variable capacitor, wherein the first variable capacitance includes a first terminal, a second terminal, and an input for setting the capacitance value, wherein the first terminal of the first variable capacitor is connected to the second terminal of the first transistor, and wherein the second terminal of the first variable capacitor is connected to the second terminal of the first inductor; transmitting, by a second transistor, a second differential modulated signal to the second terminal of the first inductor, wherein the second transistor includes a gate, a first terminal for receiving the second differential modulated signal, and a second terminal, wherein the gate of the second transistor is connected to the output of the multiplexer, and wherein the second terminal of the second transistor is connected to the second terminal of the first inductor; mutually coupling a second inductor to the first inductor, wherein the second inductor includes a first terminal and a second terminal; transmitting, by a balun-bias switch, a power supply voltage or the ground potential to the second terminal of the second inductor, wherein the balun-bias switch includes a first input for receiving the ground potential, a second input for receiving a power supply voltage, a third input for receiving an inverse of the enable signal, and an output, wherein the output of the balun-bias switch is connected to the second terminal of the second inductor; coupling, by a second capacitor, a polar signal to the first terminal of the second inductor, wherein the second capacitor includes a first terminal connected to the first terminal of the second inductor, and a second terminal for receiving the polar signal, wherein the first terminal of the second capacitor is connected to the first terminal of the second inductor; and switching, by a port-switch, the first terminal of the second inductor to the output of the programmable matching network, wherein the port-switch includes a first input for receiving the enable signal, a second input for receiving the inverse of the enable signal, a third input, and an output, wherein the third input of the port-switch is connected to the first terminal of the second inductor.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 8 is a schematic diagram of the digital power amplifier (DPA) of FIG. 7 according to an embodiment of the present disclosure;

FIG. 9 is a schematic diagram of a unit cell of the DPA of FIG. 8 according to an embodiment of the present disclosure;

FIG. 10 is a schematic diagram of a unit cell of the DPA of FIG. 8 according to an embodiment of the present disclosure;

DETAILED DESCRIPTION OF EMBODIMENTS OF THE PRESENT DISCLOSURE

Figure 1:
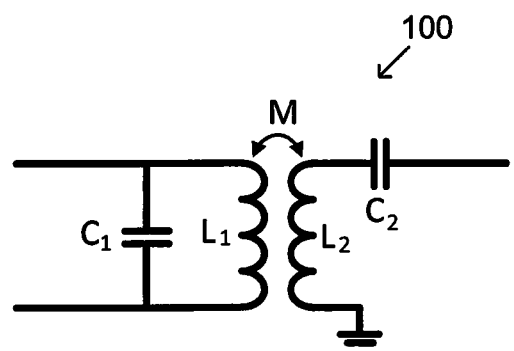
FIG. 1 is a schematic matching network for an I/Q signal path.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

The present disclosure concerns an apparatus for and method of a programmable matching network. While the present disclosure is described with regard to 2G, 3G, and 4G wireless communication systems, the present disclosure is not limited thereto, and is applicable to other suitable systems.

To minimize cost and reduce the size of a radio frequency integrated circuit (RFIC), the present disclosure concerns a programmable matching network that may be programmed to combine multiple types of signal paths, where each signal path is optimized for a different wireless communication standard.

FIG. 1 is a schematic matching network 100 for an in-phase/quadrature phase (I/Q) signal path. An I/Q signal path is used, for example, in 3G and 4G wireless communication systems. However, the present disclosure is not limited to I/Q signal paths for 3G or 4G wireless communication systems. In an embodiment of the present disclosure, an I/Q signal is received from a frequency mixer, but the present disclosure is not limited thereto.

Referring to FIG. 1, the matching network 100 includes a first capacitor C1, a first inductor L1, a second inductor L2, and a second capacitor C2. A differential input I/Q signal is received at each of a first and a second terminal of the first capacitor C1. The first capacitor C1 is connected in parallel with the first inductor L1. The second inductor L2 is mutually coupled (M) to the first inductor L1. A first terminal of the second inductor L2 is connected to a ground potential. A second terminal of the second inductor L2 is connected to a first terminal of the second capacitor C2, and a second terminal of the second capacitor C2 is the output of the matching network 100.

Figure 2:
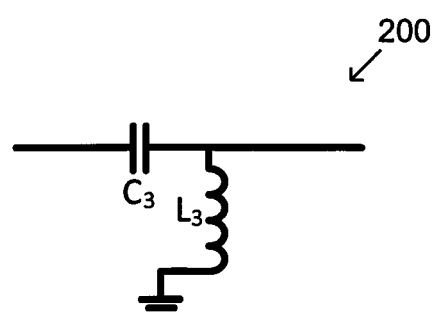
FIG. 2 is a schematic diagram of a matching network for a polar signal path.

FIG. 2 is a schematic diagram of a matching network 200 for a polar signal path. A polar signal path is used, for example, in a 2G wireless communication system. However, the present disclosure is not limited to a polar signal path for a 2G wireless communication system. A polar signal-path requires a matching network to deliver high output power (on the order of 8-10 dBm).

Referring to FIG. 2, the matching network 200 includes a capacitor C3 and an inductor L3. A single-ended input polar signal is received at a first terminal of the capacitor C3. A second terminal of the capacitor C3 is connected to a first terminal of the inductor L3. A second terminal of the inductor L3 is connected to the ground potential. The second terminal of the capacitor C3 is the output of the matching network 200.

The matching network 200 of requires one inductor $L_3$, while the matching network 100 of FIG. 1 requires two mutually coupled inductors $L_1$ and $L_2$. Thus, two independent matching networks 100 and 200 for I/Q and polar signal-paths, respectively, would require three inductors.

Figure 3:
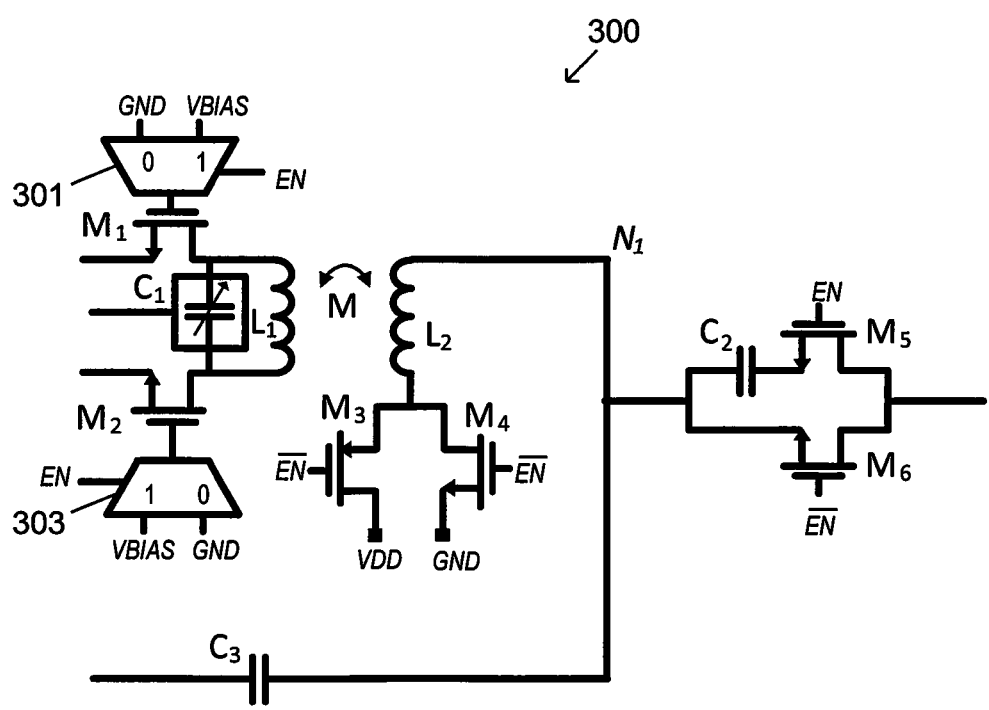
FIG. 3 is a schematic diagram of a programmable matching network according to an embodiment of the present disclosure.

FIG. 3 is a schematic diagram of a programmable matching network 300 according to an embodiment of the present disclosure. The programmable matching network 300 may be programmed for either an I/Q signal path or a polar signal path, where only two inductors are required, which reduces the number of inductors by one as compared to the two independent matching networks 100 and 200 of FIGS. 1 and 2, respectively. The matching network 300 includes two signal paths, a polar signal path which can transmit constant-envelope signals and an I/Q signal-path which can transmit variable envelope signals. The two transmit signal-paths must drive a 50-ohm load-impedance.

Referring to FIG. 3, the programmable matching network 300 includes a first transistor M1, a second transistor M2, a third transistor M3, a fourth transistor M4, a first transistor M5, a sixth transistor M6, a first variable capacitor C1, a second capacitor C2, a third capacitor C3, a first inductor L1, a second inductor L2, a first multiplexer 301, and a second multiplexer 303. The programmable matching network 300 includes two signal-paths: an I/Q-path (e.g., a 3G or 4G wireless communication system) and a polar path (e.g. a radio frequency digital to analog (RFDAC) path for a 2G wireless communication system). The programmable matching network 300 combines an I/Q signal path and a polar signal path while reducing the number of inductors by one as compared to individual matching networks for an I/Q signal-path and a polar signal-path as illustrated in FIGS. 1 and 2.

The first multiplexer 301 (i.e., a bias multiplexer for the first transistor M1) has a first input for receiving a ground potential (GND), a second input for receiving a bias voltage $V_{BIAS}$, a control input for receiving an enable signal EN, and an output connected to a gate of the first transistor M1. $V_{BIAS}$ is a voltage that represents a logical 1. When EN is a logical 0, the output of the first multiplexer 301 is the ground potential or a logical 0. When EN is a logical 1, the output of the first multiplexer 301 is $V_{BIAS}$ or a logical 1. GND and $V_{BIAS}$ are direct current (DC) bias voltages. EN is a control-signal to program the programmable matching network as either an I/Q path when EN is a logic 1 or a polar path when EN is a logic 0.

The first transistor M1 is an n-channel metal oxide semiconductor field effect transistor (NMOSFET), but the present disclosure is not limited thereto. The gate of the first transistor M1 is connected to the output of the first multiplexer 301. A source of the first transistor M1 receives a first of the two differential inputs of an I/Q signal. A drain of the first transistor M1 is connected to a first terminal of the first variable capacitor C1 and a first terminal of the first inductor L1.

The first variable capacitor C1 has a second terminal connected to a second terminal of the first inductor L1, a drain of the second transistor M2, and an input for selecting a capacitance value of the first variable capacitor C1. The first variable capacitor C1 may be a binary-weighted capacitor array, but the present disclosure is not limited thereto.

The first inductor L1 is mutually coupled (M) to the second inductor L2. The first terminal of the first inductor L1 is connected to the drain of the first transistor M1 and the first terminal of the first variable capacitor C1. The second terminal of the first inductor L1 is connected to a drain of the second transistor M2.

The second transistor M2 is an NMOSFET, but the present disclosure is not limited thereto. The gate of the second transistor M2 is connected to the output of the second multiplexer 303. A source of the second transistor M2 receives a second of the two differential inputs of an I/Q signal. The drain of the second transistor M2 is connected to the second terminal of the first variable capacitor C1 and the second terminal of the first inductor L1.

The second multiplexer 303 (i.e., a bias multiplexer for the second transistor M2) has a first input for receiving the ground potential, a second input for receiving the bias voltage $V_{BIAS}$, a control input for receiving the enable signal EN, and an output connected to the gate of the second transistor M2. When EN is a logical 0, the output of the second multiplexer 303 is the ground potential or a logical 0. When EN is a logical 1, the output of the second multiplexer 303 is $V_{BIAS}$ or a logical 1. In an embodiment of the present disclosure, the second multiplexer 303 may be omitted, where the output of the first multiplexer 301 is connected to the gate of the second transistor M2.

The first multiplexer, 301, the second multiplexer 303, the first transistor M1, and the second transistor M2 operate as a bias-multiplexer block. When the programmable matching network 300 is programmed for an I/Q path, $V_{BIAS}$ is applied to the gates of the first transistor M1 and the second transistor M2. The first transistor M1 and the second transistor M2 operate as cascode devices on top of an I/Q modulator. When the programmable matching network 300 is programmed for a polar path, GND is applied to the gates of the first transistor M1 and the second transistor M2. As a result, the first transistor M1 and the second transistor M2 operate as switches that are turned OFF, which disconnects the I/Q modulator from the signal-path.

The second inductor L2 is mutually coupled to the first inductor L1. A first terminal of the second inductor L2 is connected to a first terminal of the second capacitor C2, a source of the sixth transistor M6, and a first terminal of the third capacitor C3. A second terminal of the second inductor L2 is connected to a source of the third transistor M3 and a drain of the fourth transistor M4. In an embodiment of the present disclosure, the inductance values of the first inductor L1 and the second inductor L2 in an I/Q path are independently obtained through a load-pull analysis, and the first inductor L1 and the second inductor L2 may have different values.

The third transistor M3 is a p-channel metal oxide semiconductor field effect transistor (PMOSFET), but the present disclosure is not limited thereto. The gate of the third transistor M3 receives the inverse of the enable signal ($\overline{EN}$). A source of the third transistor M3 is connected to the second terminal of the second inductor L2. A drain of the third transistor M3 is connected to a DC supply voltage (e.g. VDD).

The fourth transistor M4 is an NMOSFET, but the present disclosure is not limited thereto. The gate of the fourth transistor M4 receives the inverse of the enable signal ($\overline{EN}$). A drain of the fourth transistor M4 is connected to the second terminal of the second inductor L2. A source of the fourth transistor M4 is connected to the ground potential. The third transistor M3 and the fourth transistor M4 form a balun-bias switch. The transistors M3 and M4 operate as ON/OFF switches in the balun-bias switch. When the programmable matching network 300 is programmed for an I/Q path, transistor M3 is ON, transistor M4 is OFF, and the balun-bias switch is biased at the supply voltage VDD. When the programmable matching network 300 is programmed for a polar path, transistor M3 is OFF, transistor M4 is ON, and the balun-bias switch is biased to GND. The bias on the second inductor L2 depends on whether the programmable matching network 300 is programmed for an I/Q path or a polar path.

The third capacitor C3 has a second terminal for receiving a single-ended input polar signal. The first terminal of the third capacitor C3 is connected to the first terminal of the second inductor L2, the first terminal of the second capacitor C2, and the source of the sixth transistor M6.

The second capacitor C2 has the first terminal connected to the first terminal of the second inductor L2 and the first terminal of the third capacitor C3. A second terminal of the second capacitor C2 is connected to a source of the fifth transistor M5.

The fifth transistor M5 is an NMOSFET, but the present disclosure is not limited thereto. The gate of the fifth transistor M5 receives the enable signal (EN). The source of the fifth transistor M5 is connected to the second terminal of the second capacitor C2. A drain of the fifth transistor M5 is connected to a drain of the sixth transistor M6 and is the output of the programmable matching network 300.

The sixth transistor M6 is an NMOSFET, but the present disclosure is not limited thereto. The gate of the sixth transistor M6 receives the inverse of the enable signal ($\overline{EN}$). The source of the sixth transistor M6 is connected to the first terminal of the second capacitor C2, the second terminal of the second inductor L2, and the first terminal of the third capacitor C3. A drain of the sixth transistor M6 is connected to the drain of the fifth transistor M5 and is the output of the programmable matching network 300. The second capacitor C2, the fifth transistor M5, and the sixth transistor M6 form an output port-switch, where transistors M5 and M6 operate as ON/OFF switches. When the programmable matching network 300 is programmed for an I/Q path, transistor M5 is ON and transistor M6 is OFF. When the programmable matching network 300 is programmed for a polar path, transistor M5 is OFF and transistor M6 is ON. By changing the bias-voltage at the first terminal of the second inductor L2 when the programmable matching network 300 is programmed as an I/Q path or a polar path, an insertion-loss of the output port-switch is minimized.

A cellular transmitter is required to support several output-ports. Each output-port is connected to the transmitter via a port-switch. The present disclosure describes a technique to reduce the insertion-loss and improve the reliability of the port-switch when the polar signal-path and I/Q signal-path are combined.

The I/Q signal-path and the polar path drive the same output-port. Therefore, the outputs of the two signal-paths are merged using port-switches. The fifth transistor M5 is the port-switch for the I/Q path, and the sixth transistor M6 is the port switch for the polar path. In an embodiment of the present disclosure, the DC bias-voltage at the first terminal of the second inductor L2 is changed according to how the programmable matching network 300 is programmed to minimize the insertion loss in I/Q-path due to the sixth transistor M6.

In an embodiment of the present disclosure, the programmable matching network may be implemented on an integrated circuit (IC), where the circuitry of the polar-path of the programmable matching network 300 may be embedded within the circuitry of the I/Q path of the programmable matching network 300 to minimize circuit area.

The bias on the second terminal of the secondary inductor L2 depends on whether the programmable matching network 300 is programmed as an I/Q path or polar path. The second terminal of the second inductor L2 is biased at GND for a polar path or VDD for an I/Q path. In both cases, the voltage of the second terminal of the second inductor L2 tracks the voltage of the first terminal of the second inductor L2. Assuming an arbitrary bias voltage $V_{CM}$, if a signal in either path is sinusoidal with an amplitude $V_A$, the voltage on the first terminal of the second inductor L2 can be expected to swing from $V_{CM}$ minus $V_A$ to $V_{CM}$ plus $V_A$.

When the programmable matching network 300 is programmed for an I/Q path, the gate of the fifth transistor M5 is biased to VDD and the gate of the sixth transistor M6 is pulled to GND. In an embodiment of the present disclosure, the fifth transistor M5 and the sixth transistor M6 may be NMOSFETS in a deep n-well semiconductor process, where the deep n-well is biased to GND. However, the present disclosure is not limited thereto. If $V_A$ is less than VDD, then the first terminal of the second inductor L2 is always larger than GND. If $V_{CM}$ were equal to GND instead of VDD, the lowest-voltage at the first terminal of the second inductor L2 is $-V_A$. Therefore, if $V_A$ is larger than the reverse turn-on voltage of a parasitic diode in the well in which the sixth transistor M6 is formed, then the parasitic diode will turn ON, increasing insertion loss in the I/Q-path. However, when the programmable matching network 300 is programmed for an I/Q path, $V_{CM}$ is equal to VDD, the lowest-voltage at the first terminal of the second inductor L2 is VDD minus $V_A$, and insertion loss is minimized.

When the programmable matching network 300 is programmed for a polar path, the gate of transistor M5 is pulled to GND, the gate of the sixth transistor M6 is biased to VDD. In an embodiment of the present disclosure, the fifth transistor M5 and the sixth transistor M6 may be NMOSFETS in a deep n-well semiconductor process, where the deep n-well is biased to GND. However, the present disclosure is not limited thereto. If $V_{CM}$ is equal to VDD, the highest node-voltage at the first terminal of the second inductor L2 is VDD plus $V_A$. Since the voltage on the gate of the sixth transistor M6 is VDD, the source of the sixth transistor M6 is biased at a higher voltage than the gate of the sixth transistor M6. Since the gate-to-source voltage is negative the resistance of the sixth transistor M6 will be large and there will be large insertion-loss. However, when the programmable matching network 300 is programmed for a polar path, $V_{CM}$ is GND, the highest voltage at the first terminal of the second inductor L2 is $V_A$. Since the gate-voltage is always larger than the source-voltage the insertion loss is minimized.

Thus, by applying different bias potentials (e.g., VDD or GND) to the second terminal of the second inductor when the programmable matching network 300 is programmed for a I/Q path and a polar-path, respectively, the insertion-loss is minimized for each programmed path.

Figure 4:
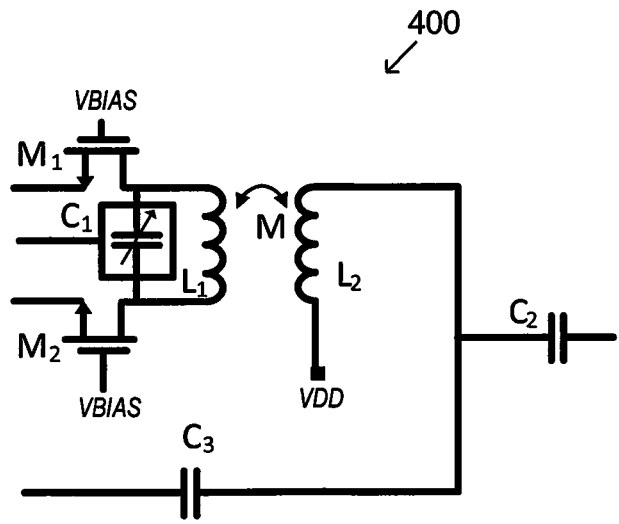
FIG. 4 is a schematic diagram of the programmable matching network of FIG. 3 programmed as a matching network for an I/Q signal path.

FIG. 4 is a schematic diagram of the programmable matching network 300 of FIG. 3 programmed as a matching network 400 for an I/Q signal path (e.g., EN=1 and $\overline{EN}$=0).

Referring to FIG. 4, the matching network 400 includes a first transistor M1, a second transistor M2, a first variable capacitor C1, a second capacitor C2, a third capacitor C3, a first inductor L1, and a second inductor L2.

The first transistor M1 and the second transistor M2 are NMOSFETs, but the present disclosure is not limited thereto. $V_{BIAS}$ is applied to the gate of the first transistor M1 and the second transistor M2. As a result, the first transistor M1 and the second transistor M2 are biased in saturation and function as cascode-devices for the I/Q path. A source of the first transistor M1 receives a first of the two differential inputs of an I/Q signal. A drain of the first transistor M1 is connected to a first terminal of the first variable capacitor C1 and a first terminal of the first inductor L1.

The first variable capacitor C1 has a second terminal connected to a second terminal of the first inductor L1 and a drain of the second transistor M2, and an input for selecting a capacitance value of the first variable capacitor C1. The first variable capacitor C1 may be a binary-weighted capacitor array, but the present disclosure is not limited thereto.

The first inductor L1 is mutually coupled (M) to the second inductor L2. The first terminal of the first inductor L1 is connected to the drain of the first transistor M1 and the first terminal of the first variable capacitor C1. The second terminal of the first inductor L1 is connected to a drain of the second transistor M2 and the second terminal of the first variable capacitor C1.

A source of the second transistor M2 receives a second of the two differential inputs of an I/Q signal. The drain of the second transistor M2 is connected to the second terminal of the first variable capacitor C1 and the second terminal of the first inductor L1.

The second inductor L2 is mutually coupled to the first inductor L1. A first terminal of the second inductor L2 is connected to a first terminal of the second capacitor C2 and a first terminal of the third capacitor C3. A second terminal of the second inductor L2 is connected to a DC supply voltage (e.g. VDD) to minimize insertion-loss.

A second terminal of the second capacitor C2 is the output of the matching network 400, and a second terminal of the third capacitor C3 operates in a high-impedance state (e.g. is floating) and does not introduce any loading effect on the I/Q path.

Figure 5:
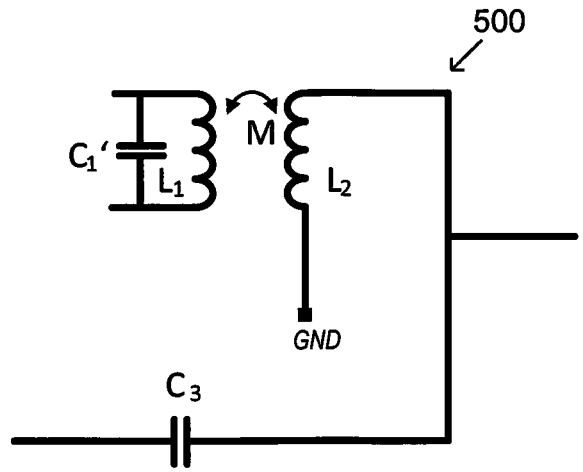
FIG. 5 is a schematic diagram of the programmable matching network of FIG. 3 programmed as a matching network for a polar signal path.

FIG. 5 is a schematic diagram of the programmable matching network 300 of FIG. 3 programmed as a matching network 500 for a polar signal path (e.g., EN=0, $\overline{EN}$=1, and a control signal on the first variable capacitor C1 sets the first variable capacitor C1 to a capacitance value of C1').

Referring to FIG. 5, the matching network 500 includes a first capacitor C1', a second capacitor C3, a first inductor L1, and a second inductor L2.

The first capacitor C1' has a first terminal connected to a first terminal of the first inductor L1 and a second terminal connected to a second terminal of the first inductor L1.

The first inductor L1 is mutually coupled to the second inductor L2. The first terminal of the first inductor L1 is connected to the first terminal of the first capacitor C1'. The second terminal of the first inductor L1 is connected to the second terminal of the first capacitor C1'.

The second inductor L2 is mutually coupled to the first inductor L1. A first terminal of the second inductor L2 is connected to a first terminal of a second capacitor C3 and an output of the matching network 500. A second terminal of the second inductor L2 is connected to a GND to minimize insertion-loss.

A second terminal of the second capacitor C3 receives a polar signal for the polar path.

Figure 6:
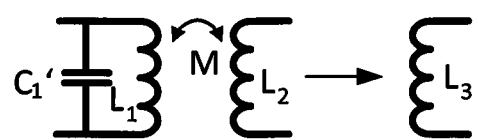
FIG. 6 is an illustration indicating that a combination of the L1, L2, and C1' of FIG. 5 is equivalent to L3 of FIG. 2.

With EN=0, $\overline{EN}$=1, and a control signal on the first variable capacitor C1 to set the first variable capacitor C1 to a capacitance value of C1', the gates of the first transistor M1 and the second transistor M2 of FIG. 3 are biased at GND through the first multiplexer 301 and the second multiplexer 303, respectively. As a result, the first transistor M1 and the second transistor M2 operate in the cut-off region and function as turned OFF switches. Since the first transistor M1 and the second transistor M2 operate as turned OFF switches, the I/Q signal-path does not introduce any loading effect on the polar signal-path. In the port-switch, the gate of the fifth transistor M5 is biased to GND (e.g. acts as a turned OFF switch) and gate of the sixth transistor M6 is biased to VDD (e.g. acts as a turned ON switch). In effect, the second capacitor C2 is removed from the signal-path. The gates of the third transistor M3 and the fourth transistor M4 of FIG. 3 are biased at VDD, respectively. As a result, the third transistor M3 operates in the cut-off region and functions as turned OFF switches and the fourth transistor acts as a turned ON switch. Thus, the second inductor L2 is biased at GND to minimize the insertion-loss of the sixth transistor M6. The first capacitor C1' is connected across the first inductor L1 and is changed from C1 when the programmable matching network 300 is programmed for the I/Q path to C1' when the programmable matching network 300 is programmed for the polar path. C1' in parallel with the mutually coupled first inductor $L_1$ and the second inductor $L_2$ is equivalent to the inductor L3 of FIG. 2, as illustrated in FIG. 6 and described below in more detail. Thus, the programmable matching network 300 of FIG. 3 may be programmed for an I/Q path or a polar path using just two inductors, whereas individual matching networks for an I/Q path and a polar path as illustrated in FIGS. 1 and 2, respectively, require three inductors.

FIG. 6 is an illustration indicating that the combination of the first inductor L1, the second inductor L2, and the first capacitance C1' of FIG. 5 is equivalent to L3 of FIG. 2. The value of C1' is set by the control signal to the first variable capacitor C1 of FIG. 3 such that, at a predetermined frequency, C1' in parallel with the mutually coupled first inductor L1 and the second inductor L2 is equivalent to the inductor L3 of FIG. 2 for a polar path.

Figure 7:
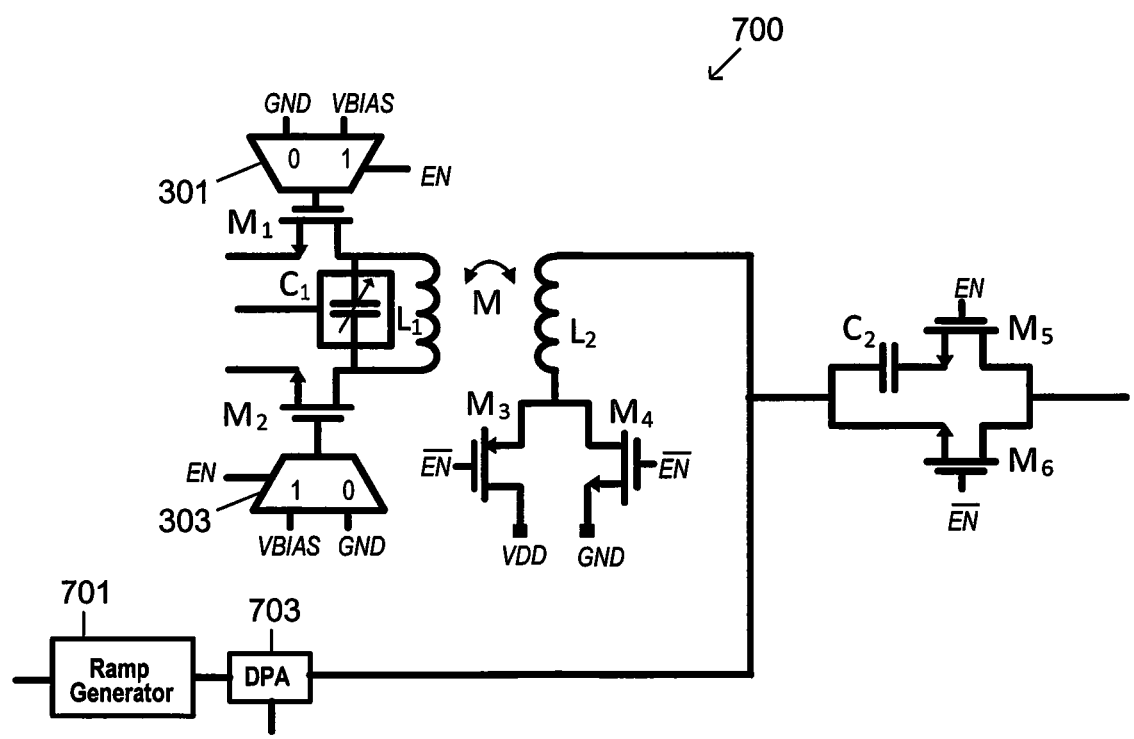
FIG. 7 is a schematic diagram of the programmable matching network according to an embodiment of the present disclosure.

FIG. 7 is a schematic diagram of the programmable matching network 700 according to an embodiment of the present disclosure. The programming matching network 700 includes a ramp generator 701, a digital power amplifier (DPA) 703, and the programmable matching network 300 of FIG. 3, and omits the third capacitor C3. The components of the matching network 700 that are in common with the matching network 300 of FIG. 3 are connected, and operate, in the same manner as described above. Descriptions of the components common between the programmable matching network 300 of FIG. 3 and the programmable matching network 700 of FIG. 7 are not repeated below.

Technology for cellular communication is in a constant state of evolution and network providers are introducing the latest 4G technologies into the market, however, 2G technologies still account for approximately 60% of the total mobile broadband connections. Therefore, for the foreseeable future cellular handsets must concurrently support 2G, 3G, and 4G modes of communication. Moreover, reducing the cost of development demands the highest possible levels of integration within a minimum IC area. A dedicated signal path for each standard would allow the optimization of power consumption and performance at the expense of larger IC area and higher material costs. Consequently, there is a need for a single reconfigurable signal-path shared between all standards in spite of significantly different electrical and system-specifications. A polar transmitter achieves good performance with low power consumption. However, a polar transmitter can only deliver around 0 dBm power and has no ramping capability. Therefore, a dedicated switching-mode 2G power amplifier (PA) with a high-gain and ramping control is required for a polar transmitter, increasing overall power consumption, material costs, and printed circuit board (PCB) area.

The programmable matching network 700 includes a DPA based polar path (e.g. a 2G Gaussian minimum shift keying (GMSK) transmitter with on-chip ramping embedded with an I/Q path (e.g., 3G and 4G). The DPA based polar path of the programmable matching network 700 is suited for use with a high-efficiency multi-mode-multi-band (MMMB) PA, because it can achieve an output power of +8 dBm, a dynamic-range greater than 50 dB, an output RF spectrum (ORFS) less than −67 dBc while consuming 18 mA (low-band) or 22 mA (mid-band) from a 1.8V power supply. To minimize IC area, the programmable matching network 700 matching network combines an I/Q path and a polar path.

Referring to FIG. 7, the ramp generator 701 has an input and an output bus. The ramp generator 701 may be preprogrammed to provide a predetermined ramp function at its output bus. The output bus of the ramp generator 701 is connected to an input bus of the DPA 703. The input of the ramp generator 701 controls the ramp generator 701 to provide the predetermined ramp function at the output bus. In an embodiment of the present disclosure, the ramp generator 701 provides a 6-bit ramp function at the output bus, but is not limited thereto.

2G is a time division multiple access (TDMA) standard. A base station allocates one time-slot to a mobile device for transmission and assigns a target output power ($P_{OUT}$). For every active slot, the output RF power of the transmitter must ramp-up to a different $P_{OUT}$. Ramping up too quickly degrades the switching ORFS, and ramping up too slowly violates the output-power versus time profile. The ramp generator 701 receives a synchronization signal from a baseband IC denoting the start of a slot and a 6-bit code corresponding to the desired slot $P_{OUT}$. At the start of the slot, a 7-bit code going from 0 to full-scale is generated from a programmable look-up-table block that stores a customizable ramp shape. The ramp-code is then digitally multiplied and scaled to ensure that the ramp rises to the target $P_{OUT}$. Finally, before being applied to the DPA, the ramp-generation logic skips the codes at the transition between high-power/low-power modes where the DPA output-power is non-monotonic.

The DPA 703 has an input bus connected to the output bus of the ramp generator 701, a control bus, and an output connected to the first terminal of the second inductor L2 and the first terminal of the second capacitor C2.

FIG. 8 is a schematic diagram of the DPA of FIG. 7 according to an embodiment of the present disclosure. The DPA 703 should not introduce any loss on the I/Q path in the OFF state and vice-versa. In addition, the DPA 703 and I/Q-path must drive a common output port.

Referring to FIG. 8, the DPA 703 includes an input bus connected to the output bus of the ramp generator 701, a control bus, and an output connected to the first terminal of the second inductor L2 and the first terminal of the second capacitor C2. In an embodiment of the present disclosure, the input bus includes, but is not limited to, a 6-bit bus. The control bus includes all of the control signals necessary to operate the DPA 703. The control signals may include, but are not limited to, a differential phase-modulated clock signal (e.g. a positive clock input INP and a negative clock input INN), a select signal SEL, an inverse of the SEL signal (e.g. $\overline{SEL}$), and, if necessary, a control signal $V_{CTRL}$.

The DPA 703 includes, but is not limited to, 32 unit cells. Five bits of the input bus are used to select one or more of the 32 unit cells. Each unit cell receives the control signals necessary to operate the unit cell. The outputs of the 32 unit cells are connected to a first terminal of a modulation capacitor $C_{MOD}$. The second terminal of $C_{MOD}$ is connected to the output of the DPA 703. In an embodiment of the present disclosure, the $C_{MOD}$ is a 200 femtofarad (fF) capacitor, but the present disclosure is not limited thereto. Transistor M81 is connected as a switch in parallel with $C_{MOD}$. In an embodiment of the present disclosure, the transistor M81 is an NMOSFET, but the present disclosure is not limited thereto. The source of the transistor M81 is connected to the first terminal of $C_{MOD}$. The drain of the transistor M81 is connected to the second terminal of $C_{MOD}$. The gate of the transistor M81 receives the sixth bit of the input bus. When the sixth bit is a logical 0, the transistor M81 is turned OFF, and $C_{MOD}$ is connected between the 32 unit cells and the output of the DPA 703. When the sixth bit is a logical 1, the transistor M81 is turned ON, short-circuiting $C_{MOD}$ and connecting the outputs of the 32 unit cells directly to the output of the DPA 703.

The 2G standard specifies a gain-control range of 30 dB. However, in order to meet the power-ramping requirement during turn-ON, a gain-control range of the 50 dB is desirable. Therefore, the DPA 703 has uses the sixth bit of the output bus of the ramp generator 701 (e.g. the most significant bit (MSB) of the six-bit output bus) which introduces $C_{MOD}$ (e.g. 200 fF) in series to switch the DPA 703 from a high-power mode to a low-power mode in order to extend the dynamic-range of the programmable matching network 700. The gain-step of the DPA 703 increases monotonically (in the dB scale) as the control code reduces from the maximum (e.g. 31) to the minimum (e.g. 1). In the worst-case, when the DPA 703 goes from 2 to 1, the step-size is 6 dB. Since a gain-step size of less than 1.5 dB is targeted across a 50 dB dynamic-range, a 10 dB overlap has been introduced between the high-power mode and the low-power mode of the DPA 703. The fine-resolution, high-end of the low-power mode overlaps with the coarse-resolution, low-end of the high-power mode.

FIG. 9 is a schematic diagram of a unit cell of the DPA 703 of FIG. 8 according to an embodiment of the present disclosure.

Referring to FIG. 9, each unit cell of the DPA 703 includes a first transistor M91, a second transistor M93, a logical OR gate 95, a logical NAND gate 97, and a capacitor $C_{UNIT}$.

The first transistor M91 is a PMOSFET, but is not limited thereto. The first transistor M91 has a source connected to a power supply voltage VDD, a gate connected to an output of the OR gate 95, and a drain connected to a drain of the second transistor M93 and a first terminal of $C_{UNIT}$.

The second transistor M93 is an NMOSFET, but is not limited thereto. The second transistor M93 has a drain connected to the drain of the first transistor M91 and the first terminal of $C_{UNIT}$, a gate connected to an output of the NAND gate 97, and a source connected to GND.

The OR gate 95 includes a first input for receiving the $\overline{SEL}$ signal, a second input for receiving the INN signal, and an output connected to the gate of the first transistor M91.

The NAND gate 97 includes a first input for receiving the SEL signal, a second input for receiving the INP signal, and an output connected to the gate of the second transistor M93.

The first terminal of $C_{UNIT}$ is connected to the drains of the first transistor M91 and the second transistor M93. A second terminal of $C_{UNIT}$ is the output of the unit cell.

The first transistor M91 and the second transistor M93 of a unit cell functions as an inverter under the control of the INP, INN, SEL, and $\overline{SEL}$ signals. When a unit cell is ON, $C_{UNIT}$ is driven by the modulated clock signals (INP and INN). In the OFF state, $C_{UNIT}$ is pulled to ground. Pulling $C_{UNIT}$ to ground ensures that the total capacitance at the output of the unit cell remains constant for all power-control codes and therefore minimizes insertion loss due to the programmable matching network 700.

FIG. 10 is a schematic diagram of a unit cell of the DPA of FIG. 8 according to an embodiment of the present disclosure.

Referring to FIG. 10, each unit cell of the DPA 703 includes the components of the unit cell of FIG. 9 with the addition of a third transistor M101. The connections, and the operations, of the components in common with FIG. 9 are the same as described above, except for the first transistor M91, and the descriptions of which are not repeated below.

The first transistor M91 is connected the same as in FIG. 9 except for the source, which is not connected to VDD as in FIG. 9. Instead, the source of the first transistor M91 is connected to a drain of the third transistor M101.

The third transistor M101 is a PMOSFET, but is not limited thereto. The third transistor M101 has a source connected to VDD, a gate for receiving the $V_{CTRL}$ signal, and a drain connected to the source of the first transistor M91. Under control of the $V_{CTRL}$ signal, the third transistor adds resistance to the inverter function of the first transistor M91 and the second transistor M93.

Figure 11:
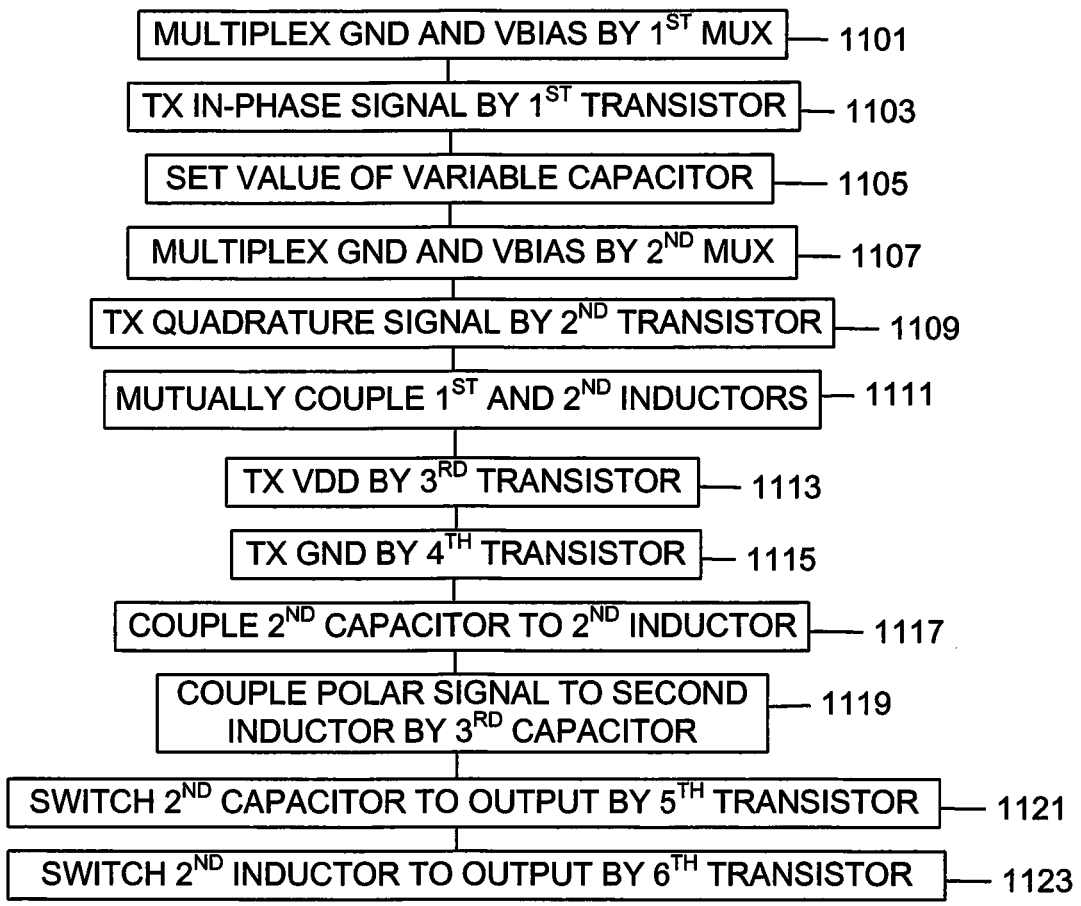
FIG. 11 is a flowchart of a method of a programmable matching network according to an embodiment of the present disclosure.

FIG. 11 is a flowchart of a method of a programmable matching network according to an embodiment of the present disclosure. An in-phase signal and a quadrature signal used in the method are differential input signals from one of a 3G wireless communication system and a 4G wireless communication system. A polar signal used in the method is a single-ended input signal from a radio frequency digital to analog converter (RFDAC) signal of a 2G wireless communication system.

Referring to FIG. 11, the method includes multiplexing, by a first multiplexer, a ground potential and a bias voltage. The first multiplexer includes a first input for receiving the ground potential, a second input for receiving the bias voltage, a third input for receiving an enable signal, and an output at 1101.

At 1103, the method includes transmitting, by a first transistor, a first differential modulated signal to a first inductor. The first transistor includes a gate connected to the output of the first multiplexer, a first terminal for receiving the first differential modulated signal, and a second terminal. The first inductor includes a first terminal connected to the second terminal of the first transistor, and a second terminal.

At 1105, the method includes setting a capacitance value, by a first variable capacitor. The first variable capacitance includes a first terminal connected to the second terminal of the first transistor, a second terminal connected to the second terminal of the first inductor, and an input for setting the capacitance value.

At 1107, the method includes multiplexing, by a second multiplexer, the ground potential and the bias voltage. The second multiplexer includes a first input for receiving the ground potential, a second input for receiving the bias voltage, a third input for receiving the enable signal, and an output.

At 1109, the method includes transmitting, by a second transistor, a second differential modulated signal to the second terminal of the first inductor. The second transistor includes a gate connected to the output of the second multiplexer, a first terminal for receiving the second differential modulated signal, and a second terminal connected to the second terminal of the second inductor.

At 1111, the method includes mutually coupling a second inductor to the first inductor. The second inductor includes a first terminal and a second terminal.

At 1113, the method includes transmitting, by a third transistor, a power supply voltage to the second terminal of the second inductor. The third transistor includes a first terminal connected to the second terminal of the second inductor, a gate for receiving an inverse of the enable signal, and a second terminal connected to the power supply voltage.

At 1115, the method includes transmitting, by a fourth transistor, the ground potential to the second terminal of the second inductor. The fourth transistor includes a first terminal connected to the ground potential, a gate for receiving the inverse of the enable signal, and a second terminal connected to the second terminal of the second inductor.

At 1117, the method includes coupling, by a second capacitor, the first terminal of the second inductor. The second capacitor includes a first terminal connected to the first terminal of the second inductor, and a second terminal.

At 1119, the method includes coupling, by a third capacitor, a polar signal to the first terminal of the second inductor. The third capacitor includes a first terminal connected to the first terminal of the second inductor, and a second terminal for receiving the polar signal.

At 1121, the method includes switching, by a fifth transistor, the second terminal of the second capacitor to an output of a programmable matching network. The fifth transistor includes a first terminal connected to the second terminal of the second capacitor, a gate for receiving the enable signal, and a second terminal connected to the output of the programmable matching network.

At 1123, the method includes switching, by a sixth transistor, the first terminal of the second inductor to the output of the programmable matching network. The sixth transistor includes a first terminal connected to the first terminal of the second inductor, a gate for receiving the inverse of the enable signal, and a second terminal connected to the output of the programmable matching network.

The first transistor, the second transistor, the fourth transistor, the fifth transistor, and the sixth transistor are each an NMOSFET, and the third transistor, is a PMOSFET.

Figure 12:
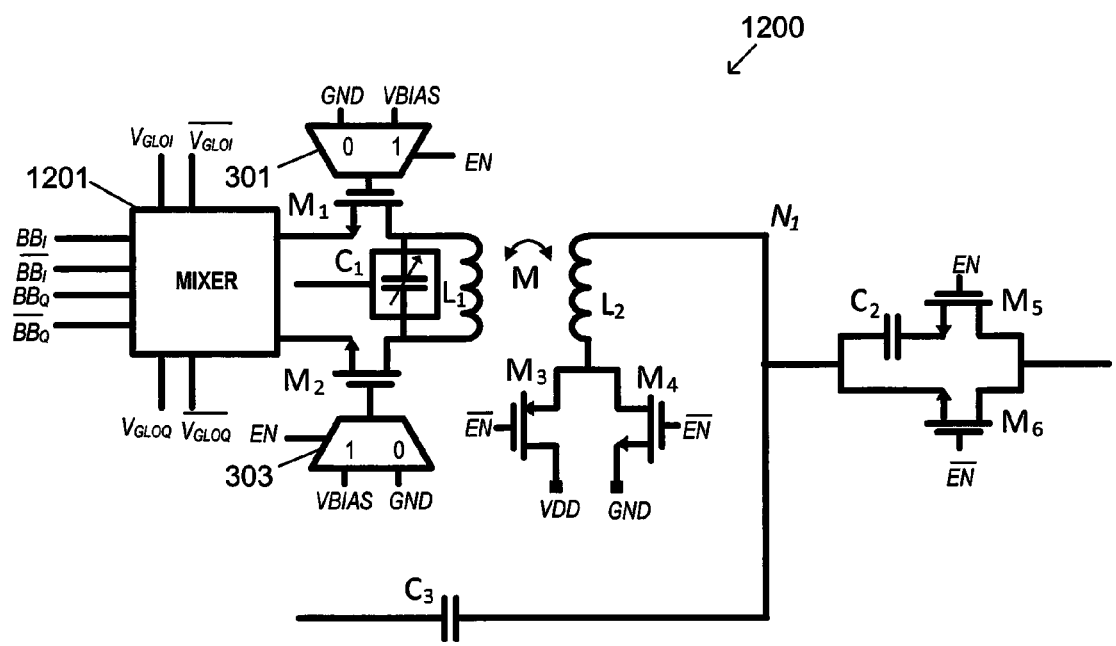
FIG. 12 is a schematic diagram of a circuit that combines the programmable matching network of FIG. 3 with a mixer according to an embodiment of the present disclosure.

FIG. 12 is a schematic diagram of a circuit 1200 that combines the programmable matching network 300 of FIG. 3 with a mixer 1201 according to an embodiment of the present disclosure. The configuration and operation of the programmable matching network 300 is described above with reference to FIG. 3 and is not repeated here.

Referring to FIG. 12, the mixer 1201 receives a first differential signal, a second differential signal, a first differential timing signal for the first differential signal, and a second differential timing signal for the second differential signal. The first differential signal may be a differential in-phase signal (I), and the second differential signal may be a differential quadrature signal (Q). A mixer that mixes an I signal and a Q signal is commonly referred to as an I/Q mixer.

The inputs to an mixer 1201 are a differential in-phase baseband current signal (e.g., a baseband in-phase current signal ($BB_I$) and an inverse of the $BB_I$ (e.g. $\overline{BB_I}$)), a differential quadrature-phase baseband current signal (e.g., a baseband quadrature-phase current signal ($BB_Q$) and an inverse of the $BB_Q$ (e.g. $\overline{BB_Q}$)), a differential timing voltage signal for the differential in-phase baseband signal (e.g., $V_{GLOI}$) and an inverse of the $V_{GLOI}$ (e.g. $\overline{V_{GLOI}}$)), and a differential timing voltage signal for the differential quadrature-phase baseband signal (e.g., $V_{GLOQ}$) and an inverse of the $V_{GLOQ}$ (e.g. $\overline{V_{GLOQ}}$)).

The outputs of the mixer 1201 are a first differential modulated current signal connected to the source of the first transistor M1 of the programmable matching network 300 of FIG. 3 and a second differential modulated current signal connected to the source of the second transistor M2 of the programmable matching network 300. Each of the first differential modulated signal and the second differential modulated signal is a mix or combination of an in-phase current signal component (e.g., $BB_I$ or $\overline{BB_I}$) and a quadrature-phase current signal component (e.g., $BB_Q$ or $\overline{BB_Q}$), depending on the voltage values of the timing signals ($V_{GLOI}$, $\overline{V_{GLOI}}$, $V_{GLOQ}$, and $\overline{V_{GLOQ}}$), as described below in greater detail with reference to FIGS. 13-15. For the mixing operation, the transistors M1 and M2 require a direct current (DC) bias voltage, and a clock signal. The DC bias voltage is provided by the associated multiplexer 301 or 303. The clock signal, as described below is greater detail with reference to FIG. 15, is applied through a capacitor. A resistor (e.g., a large value resistor) is connected between the output of the multiplexer 301 or 303 and the gates of the transistors M1 and M2, respectively to ensure that the circuit generating the DC bias does not load the circuit driving the clock signal.

Figure 13:
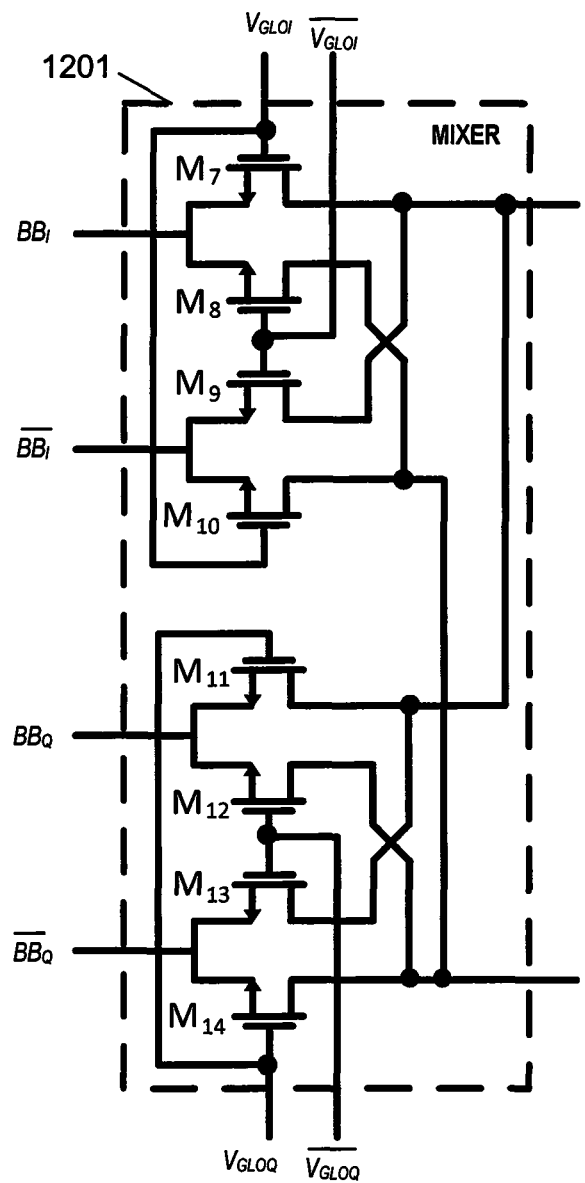
FIG. 13 is a schematic diagram of the mixer of FIG. 12 according to an embodiment of the present disclosure.

FIG. 13 is a schematic diagram of the mixer 1201 of FIG. 12 according to an embodiment of the present disclosure. The mixer 1201 receives a baseband in-phase current signal ($BB_I$), an inverse of the $BB_I$ (e.g. $\overline{BB_I}$), a baseband quadrature-phase current signal ($BB_Q$), an inverse of the $BB_Q$ (e.g. $\overline{BB_Q}$), an in-phase timing voltage signal ($V_{GLOI}$), an inverse of the $V_{GLOI}$ (e.g. $\overline{V_{GLOI}}$), a quadrature-phase timing voltage signal ($V_{GLOQ}$), and an inverse of the $V_{GLOQ}$ (e.g. $\overline{V_{GLOQ}}$). The mixer 1201 outputs a first differential modulated signal and a second differential modulated signal, where each of the first differential modulated signal and the second differential modulated signal is a mix of $BB_I$ or $\overline{BB_I}$ and $BB_Q$ or $\overline{BB_Q}$, depending on the voltage values of $V_{GLOI}$, $\overline{V_{GLOI}}$, $V_{GLOQ}$, and $\overline{V_{GLOQ}}$.

Referring to FIG. 13, the mixer 1201 includes a seventh transistor M7, an eighth transistor M8, a ninth transistor M9, a tenth transistor M10, an eleventh transistor M11, a twelfth transistor M12, a thirteenth transistor M13, and a fourteenth transistor M14. The seventh to the fourteenth transistors M7-M14 may be NMOSFET transistors. The transistors M7-M14 form two switches, where each switch includes four transistors, which is commonly referred to as a switching quad.

The seventh transistor M7 includes a gate for receiving an in-phase timing voltage signal $V_{GLOI}$, a first terminal (e.g. a source terminal for an NMOSFET transistor) for receiving a baseband in-phase current signal ($BB_I$), and a second terminal (e.g., a drain terminal for an NMOSFET transistor) for outputting a first differential modulated signal. The eighth transistor M8 includes a gate for receiving an inverse of the in-phase timing voltage signal $V_{GLOI}$ (i.e., $\overline{V_{GLOI}}$), a first terminal (e.g. a source terminal for an NMOSFET transistor) connected to the first terminal of the seventh transistor M7 for receiving the baseband in-phase current signal ($BB_I$), and a second terminal (e.g., a drain terminal for an NMOSFET transistor) for outputting a second differential modulated signal.

The ninth transistor M9 includes a gate for receiving the inverse of the in-phase timing voltage signal $V_{GLOI}$ (i.e., $\overline{V_{GLOI}}$), a first terminal (e.g. a source terminal for an NMOSFET transistor) for receiving an inverse of the baseband in-phase current signal $BB_I$ (e.g. $\overline{BB_I}$), and a second terminal (e.g., a drain terminal for an NMOSFET transistor) connected to the second terminal of the seventh transistor M7. The tenth transistor M10 includes a gate for receiving the in-phase timing voltage signal $V_{GLOI}$, a first terminal (e.g. a source terminal for an NMOSFET transistor) connected to the first terminal of the ninth transistor M9 for receiving the inverse of baseband in-phase current signal $BB_I$ (e.g. $\overline{BB_I}$), and a second terminal (e.g., a drain terminal for an NMOSFET transistor) connected to the second terminal of the eighth transistor M8.

The eleventh transistor M11 includes a gate for receiving a quadrature-phase timing voltage signal $V_{GLOQ}$, a first terminal (e.g. a source terminal for an NMOSFET transistor) for receiving a baseband quadrature-phase current signal ($BB_Q$), and a second terminal (e.g., a drain terminal for an NMOSFET transistor) connected to the second terminal of the seventh transistor M7. The twelfth transistor M12 includes a gate for receiving an inverse of the quadrature-phase timing voltage signal $V_{GLOQ}$ (i.e., $\overline{V_{GLOQ}}$), a first terminal (e.g. a source terminal for an NMOSFET transistor) connected to the first terminal of the eleventh transistor M11 for receiving the baseband quadrature-phase current signal ($BB_Q$), and a second terminal (e.g., a drain terminal for an NMOSFET transistor) connected to the second terminal of the eighth transistor M8.

The thirteenth transistor M13 includes a gate for receiving the inverse of the quadrature-phase timing voltage signal $V_{GLOQ}$ (i.e., $\overline{V_{GLOQ}}$), a first terminal (e.g. a source terminal for an NMOSFET transistor) for receiving an inverse of the baseband quadrature-phase current signal $BB_Q$ (e.g. $\overline{BB_Q}$), and a second terminal (e.g., a drain terminal for an NMOSFET transistor) connected to the second terminal of the eleventh transistor M11. The fourteenth transistor M14 includes a gate for receiving the quadrature-phase timing voltage signal $V_{GLOQ}$, a first terminal (e.g. a source terminal for an NMOSFET transistor) connected to the first terminal of the thirteenth transistor M13 for receiving the inverse of baseband quadrature-phase current signal $BB_Q$ (e.g. $\overline{BB_Q}$), and a second terminal (e.g., a drain terminal for an NMOSFET transistor) connected to the second terminal of the twelfth transistor M12.

Figure 14:
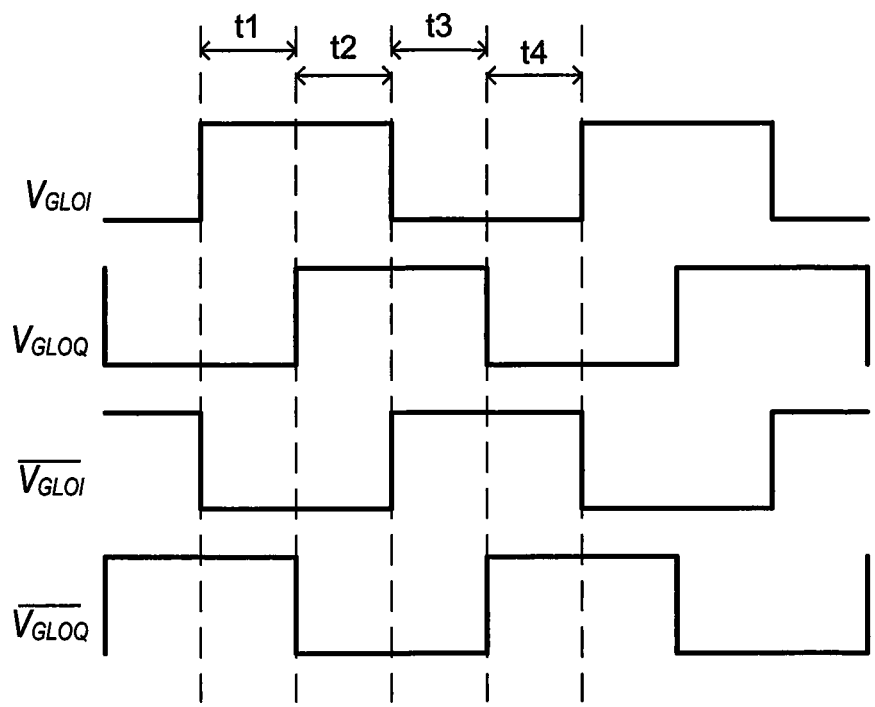
FIG. 14 is a timing diagram for timing voltage signals for the mixer of FIG. 12 according to an embodiment of the present disclosure.
Figure 15:
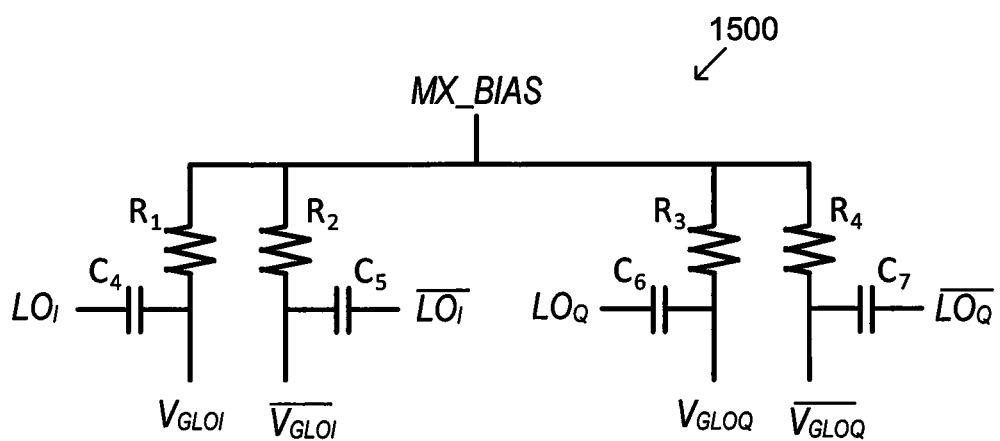
FIG. 15 is a schematic diagram of a circuit for generating timing voltage signals for the mixer of FIG. 12 according to an embodiment of the present disclosure.

FIG. 14 is a timing diagram for timing voltage input signals for the mixer 1201 of FIG. 12 according to an embodiment of the present disclosure. The timing voltage input signals are $V_{GLOI}$, $\overline{V_{GLOI}}$, $V_{GLOQ}$, and $\overline{V_{GLOQ}}$.

Referring to FIG. 14, the timing diagram illustrates two logic levels, where the lower logic level is logic level "0" and the higher logic level is logic level "1." Thus, for the time period t1, $V_{GLOI}$ is a logic "1," $V_{GLOQ}$ is logic "0," $\overline{V_{GLOI}}$ is logic "0," and $\overline{V_{GLOQ}}$ is logic "1." For these logic levels, $BB_I$ and $\overline{BB_Q}$ are combined at the source terminal of M1, and $\overline{BB_I}$ and $BB_Q$ are combined at the source terminal of M2. For the time period t2, $V_{GLOI}$ is a logic "1," $V_{GLOQ}$ is logic "1," $\overline{V_{GLOI}}$ is logic "0," and $\overline{V_{GLOQ}}$ is logic "0." For these logic levels, $BB_I$ and $BB_Q$ are combined at the source terminal of M1, and $\overline{BB_I}$ and $\overline{BB_Q}$ are combined at the source terminal of M2. For the time period t3, $V_{GLOI}$ is a logic "0," $V_{GLOQ}$ is logic "1," $\overline{V_{GLOI}}$ is logic "1," and $\overline{V_{GLOQ}}$ is logic "0." For these logic levels, $\overline{BB_I}$ and $BB_Q$ are combined at the source terminal of M1, and $BB_I$ and $\overline{BB_Q}$ are combined at the source terminal of M2. For the time period t4, $V_{GLOI}$ is a logic "0," $V_{GLOQ}$ is logic "0," $\overline{V_{GLOI}}$ is logic "1," and $\overline{V_{GLOQ}}$ is logic "1." For these logic levels, $\overline{BB_I}$ and $\overline{BB_Q}$ are combined at the source terminal of M1, and $BB_I$ and $BB_Q$ are combined at the source terminal of M2.

FIG. 15 is schematic diagram of a circuit 1500 for generating timing voltage signals for the mixer 1201 of FIG. 12 according to an embodiment of the present disclosure. The circuit 1500 includes a first resistor R1, a second resistor R2, a third resistor R3, a fourth resistor R4, a fourth capacitor C4, a fifth capacitor C5, a sixth capacitor C6, and a seventh capacitor C7.

Referring to FIG. 15, the first resistor R1 includes a first terminal connected to an output of a multiplexer (e.g., the first multiplexer 301 or the second multiplexer 303 of FIG. 12), and a second terminal for outputting $V_{GLOI}$. The fourth capacitor C4 includes a first terminal connected to the second terminal of the first resistor R1, and a second terminal for receiving a first signal (La) of a differential clock signal for a differential in-phase signal. The second resistor R2 includes a first terminal connected to an output of a multiplexer (e.g., the first multiplexer 301 or the second multiplexer 303 of FIG. 12), and a second terminal for outputting the inverse of $V_{GLOI}$ (e.g. $\overline{V_{GLOI}}$). The fifth capacitor C5 includes a first terminal connected to the second terminal of the second resistor R2, and a second terminal for receiving a second signal ($\overline{LO_I}$) of a differential clock signal for a differential in-phase signal. The third resistor R3 includes a first terminal connected to an output of a multiplexer (e.g., the first multiplexer 301 or the second multiplexer 303 of FIG. 12), and a second terminal for outputting $V_{GLOQ}$. The sixth capacitor C6 includes a first terminal connected to the second terminal of the third resistor R3, and a second terminal for receiving a first signal ($LO_Q$) of a differential clock signal for a differential quadrature-phase signal. The fourth resistor R4 includes a first terminal connected to an output of a multiplexer (e.g., the first multiplexer 301 or the second multiplexer 303 of FIG. 12), and a second terminal for outputting the inverse of $V_{GLOQ}$ (e.g. $\overline{V_{GLOQ}}$). The seventh capacitor C7 includes a first terminal connected to the second terminal of the fourth resistor R4, and a second terminal for receiving a second signal ($\overline{LO_Q}$) of a differential clock signal for a differential quadrature-phase signal.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   a multiplexer, including a first input for receiving a ground potential, a second input for receiving a bias voltage, a third input for receiving an enable signal, and an output for selecting one of the ground potential and the bias voltage based on the enable signal;
   a first transistor, including a gate, a first terminal, and a second terminal, wherein the gate of the first transistor is connected to the output of the first multiplexer, and wherein the first terminal of the first transistor receives a first differential modulated signal;
   a first variable capacitor, including a first terminal, a second terminal, and an input, wherein the first terminal of the first variable capacitor is connected to the second terminal of the first transistor, and wherein the input of the first variable capacitor is configured to set a capacitance value of the first variable capacitor;
   a first inductor, including a first terminal and a second terminal, wherein the first terminal of the first inductor is connected to the second terminal of the first transistor, and wherein the second terminal of the first inductor is connected to the second terminal of the first variable capacitor;
   a second transistor, including a gate, a first terminal, and a second terminal, wherein the gate of the second transistor is connected to the output of the first multiplexer, wherein the first terminal of the second transistor receives a second differential modulated signal, and wherein the second terminal of the second transistor is connected to the second terminal of the first inductor;

a second inductor mutually coupled to the first inductor, including a first terminal and a second terminal;

a balun-bias switch, including a first input for receiving the ground potential, a second input for receiving a power supply voltage, a third input for receiving an inverse of the enable signal, and an output, wherein the output of the balun-bias switch is connected to the second terminal of the second inductor;

a second capacitor, including a first terminal, and a second terminal for receiving a polar signal, wherein the first terminal of the second capacitor is connected to the first terminal of the second inductor; and a port-switch, including a first input for receiving the enable signal, a second input for receiving the inverse of the enable signal, a third input, and an output, wherein the third input of the port-switch is connected to the first terminal of the second inductor.

2. The apparatus of claim 1, wherein the balun-bias switch is comprised of:
a third transistor, including a first terminal, a gate for receiving the inverse of the enable signal, and a second terminal, wherein the first terminal of the third transistor is connected to the second terminal of the second inductor, and wherein the second terminal of the third transistor is connected to the power supply voltage; and
a fourth transistor, including a first terminal, a gate for receiving the inverse of the enable signal, and a second terminal, wherein the first terminal of the fourth transistor is connected to the ground potential, and wherein the second terminal of the fourth transistor is connected to the second terminal of the second inductor.

3. The apparatus of claim 1, wherein the port-switch is comprised of:
a third capacitor, including a first terminal, and a second terminal, wherein the first terminal of the third capacitor is connected to the first terminal of the second inductor;
a fifth transistor, including a first terminal, a gate for receiving the enable signal, and a second terminal, wherein the first terminal of the fifth transistor is connected to the second terminal of the third capacitor; and
a sixth transistor, including a first terminal, a gate for receiving the inverse of the enable signal, and a second terminal, wherein the first terminal of the sixth transistor is connected to the first terminal of the third capacitor, and wherein the second terminal of the sixth transistor is connected to the second terminal of the fifth transistor.

4. The apparatus of claim 1, wherein the first differential modulated signal and the second differential modulated signal are each a signal that includes a combination of one of an in-phase signal and an inverse of the in-phase signal and one of a quadrature signal and an inverse of the quadrature signal from a differential-output wireless communication system.

5. The apparatus of claim 1, wherein the polar signal is a single-ended input signal from a single-output wireless communication system.

6. The apparatus of claim 3, wherein the first transistor, the second transistor, the fourth transistor, the fifth transistor, and the sixth transistor are each an n-channel metal oxide semiconductor field effect transistor (NMOSFET), and the third transistor, is a p-channel metal oxide semiconductor field effect transistor (PMOSFET), wherein the first terminal and the second terminal of each of the first transistor, the second transistor, the third transistor, the fourth transistor, the fifth transistor, and the sixth transistor are a source and a drain, respectively.

7. The apparatus of claim 1, further comprising a mixer, including a first input for receiving a first differential in-phase signal $BB_I$, a second input for receiving an inverse of the first differential in-phase signal $\overline{BB_I}$, a third input for receiving an in-phase timing voltage signal $V_{GLOI}$, a fourth input for receiving an inverse of the in-phase timing voltage signal $\overline{V_{GLOI}}$, a fifth input for receiving a first differential quadrature-phase signal $BB_Q$, a sixth input for receiving an inverse of the first differential in-phase signal $\overline{BB_Q}$, a seventh input for receiving an in-phase timing voltage signal $V_{GLOQ}$, an eighth input for receiving an inverse of the in-phase timing voltage signal $\overline{V_{GLOQ}}$, a first output and a second output, wherein the mixer is comprised of:
a seventh transistor, including a gate terminal for receiving $V_{GLOI}$, a first terminal for receiving $BB_I$, and a third terminal, wherein the third terminal of the seventh transistor is connected to the first output;
an eighth transistor, including a gate terminal for receiving $\overline{V_{GLOI}}$, a first terminal for receiving $BB_I$, and a third terminal;
a ninth transistor, including a gate terminal for receiving $\overline{V_{GLOI}}$, a first terminal for receiving $\overline{BB_I}$, and a third terminal, wherein the third terminal of the ninth transistor is connected to the first output;
a tenth transistor, including a gate terminal for receiving $V_{GLOI}$, a first terminal for receiving $\overline{BB_I}$, and a third terminal, wherein the third terminal of the tenth transistor is connected to the second terminal of the eighth transistor;
an eleventh transistor, including a gate terminal for receiving $V_{GLOQ}$, a first terminal for receiving $BB_Q$, and a third terminal, where the third terminal of the eleventh transistor is connected to the first output;
a twelfth transistor, including a gate terminal for receiving $\overline{V_{GLOQ}}$, a first terminal for receiving $BB_Q$, and a third terminal, wherein the third terminal of the twelfth transistor is connected to the second output;
a thirteenth transistor, including a gate terminal for receiving $\overline{V_{GLOQ}}$, a first terminal for receiving $\overline{BB_Q}$, and a third terminal, wherein the third terminal of the thirteenth transistor is connected to the first output; and
a fourteenth transistor, including a gate terminal for receiving $V_{GLOQ}$, a first terminal for receiving $\overline{BB_Q}$, and a third terminal, wherein the third terminal of the fourteenth transistor is connected to the second terminal of the twelfth transistor.

8. An apparatus, comprising:
a multiplexer, including a first input for receiving a ground potential, a second input for receiving a bias voltage, a third input for receiving an enable signal, and an output for selecting one of the ground potential and the bias voltage based on the enable signal;
a first transistor, including a gate, a first terminal for receiving a first differential modulated signal, and an output, wherein the gate of the first transistor is connected to the output of the multiplexer;
a first variable capacitor, including a first terminal, a second terminal, and an input configured to set a capacitance value of the first variable capacitor, wherein the first terminal of the first variable capacitor is connected to the second terminal of the first transistor;

a first inductor, including a first terminal, and a second terminal, wherein the first terminal of the first inductor is connected to the second terminal of the first transistor, and wherein the second terminal of the first inductor is connected to the second terminal of the first variable capacitor;

a second transistor, including a gate, a first terminal for receiving a second differential modulated signal, and a second terminal, wherein the gate of the second transistor is connected to the output of the multiplexer, and wherein the second terminal of the second transistor is connected to the second terminal of the first inductor;

a second inductor mutually coupled to the first inductor, including a first terminal and a second terminal;

a balun-bias switch, including a first input for receiving the ground potential, a second input for receiving a power supply voltage, a third input for receiving an inverse of the enable signal, and an output, wherein the output of the balun-bias switch is connected to the second terminal of the second inductor;

a ramp generator, including an input and an output bus, wherein the input controls the ramp generator to provide a predetermined ramp function at an output bus;

a digital power amplifier (DPA), including an input bus, a control bus for receiving all of the control signals necessary to operate the DPA, and an output, wherein the input bus of the DPA is connected to the output bus of the ramp generator, and wherein the output of the DPA is connected to the first terminal of the second inductor; and a port-switch, including a first input for receiving the enable signal, a second input for receiving the inverse of the enable signal, a third input, wherein the third input of the port-switch is connected to the first terminal of the second inductor, and an output.

9. The apparatus of claim 8, wherein the balun-bias switch is comprised of:

a third transistor, including a first terminal, a gate for receiving the inverse of the enable signal, and a second terminal, wherein the first terminal of the third transistor is connected to the second terminal of the second inductor, and wherein the second terminal of the third transistor is connected to the power supply voltage; and a fourth transistor, including a first terminal, a gate for receiving the inverse of the enable signal, and a second terminal, wherein the first terminal of the fourth transistor is connected to the ground potential, and the second terminal of the fourth transistor is connected to the second terminal of the second inductor.

10. The apparatus of claim 8, wherein the port-switch is comprised of:

a third capacitor, including a first terminal, and a second terminal, wherein the first terminal of the third capacitor is connected to the first terminal of the second inductor;

a fifth transistor, including a first terminal, a gate for receiving the enable signal, and a second terminal, wherein the first terminal of the fifth transistor is connected to the second terminal of the third capacitor; and a sixth transistor, including a first terminal, a gate for receiving the inverse of the enable signal, and a second terminal, wherein the first terminal of the sixth transistor is connected to the first terminal of the third capacitor, and wherein the second terminal of the sixth transistor is connected to the second terminal of the fifth transistor.

11. The apparatus of claim 8, wherein the first differential modulated signal and the second differential modulated signal are each a signal that includes a combination of one of an in-phase signal and an inverse of the in-phase signal and one of a quadrature signal and an inverse of the quadrature signal from a differential-output wireless communication system.

12. The apparatus of claim 8, wherein the polar signal is a single-ended input signal from a single-output wireless communication system.

13. The apparatus of claim 10, wherein the first transistor, the second transistor, the fourth transistor, the fifth transistor, and the sixth transistor are each an n-channel metal oxide semiconductor field effect transistor (NMOSFET), and the third transistor, is a p-channel metal oxide semiconductor field effect transistor (PMOSFET), wherein the first terminal and the second terminal of each of the first transistor, the second transistor, the third transistor, the fourth transistor, the fifth transistor, and the sixth transistor are a source and a drain, respectively.

14. The apparatus of claim 8, wherein the DPA further includes 32 unit cells that each receive a positive clock signal INP and a negative clock signal INN of a differential phase-modulated clock signal and five bits of the output bus of the ramp generator, a third capacitor $C_{MOD}$ connected between outputs of the 32 unit cells and the output of the DPA, and a transistor including a first terminal connected to the outputs of the 32 units cells, a gate connected to a sixth bit of the output bus of the ramp generator, and a second terminal connected to the output of the DPA.

15. The apparatus of claim 14, wherein each of the 32 unit cells includes:

an eighth transistor, including a first terminal, a gate, and a second terminal, wherein the first terminal of the eighth transistor is connected to the power supply voltage;

a ninth transistor, including a first terminal, a gate, and a second terminal, wherein the first terminal of the ninth transistor is connected to the second terminal of the eighth transistor, and wherein the second terminal of the ninth transistor is connected to the ground potential;

a NAND gate, including a first input for receiving a select (SEL) signal, a second input for receiving the INP signal, and an output, wherein the output of the NAND gate is connected to the gate of the ninth transistor;

an OR gate, including a first input for receiving a $\overline{SEL}$ signal, which is an inverse of the SEL signal, a second input for receiving the INN signal, and an output, wherein the output of the OR gate is connected to the gate of the eighth transistor; and a ninth capacitor including a first terminal, and a second terminal, wherein the first terminal of the ninth capacitor is connected to the second terminal of the eighth transistor.

16. The apparatus of claim 14, wherein each of the 32 unit cells includes:

an eighth transistor, including a first terminal, a gate for receiving a control signal $V_{CTRL}$, and a second terminal, wherein the first terminal of the eighth transistor is connected to the power supply voltage;

a ninth transistor, including a first terminal, a gate, and a second terminal, wherein the first terminal of the ninth transistor is connected to the second terminal of the eighth transistor;

a tenth transistor, including a first terminal, a gate, and a second terminal, wherein the first terminal of the tenth transistor is connected to the second terminal of the ninth transistor, and wherein the second terminal of the tenth terminal is connected to the ground potential;

a NAND gate, including a first input for receiving a select (SEL) signal, a second input for receiving the INP signal, and an output, wherein the output of the NAND gate is connected to the gate of the tenth transistor;

an OR gate, including a first input for receiving a $\overline{\text{SEL}}$ signal, which is an inverse of the SEL signal, a second input for receiving the INN signal, and an output, wherein the output of the OR gate is connected to the gate of the ninth transistor; and a ninth capacitor including a first terminal, and a second terminal, wherein the first terminal of the ninth capacitor is connected to the second terminal of the ninth transistor.

17. The apparatus of claim 8, further comprising a mixer, including a first input for receiving a first differential in-phase signal $BB_I$, a second input for receiving an inverse of the first differential in-phase signal $\overline{BB_I}$, a third input for receiving an in-phase timing voltage signal $V_{GLOI}$, a fourth input for receiving an inverse of the in-phase timing voltage signal $\overline{V_{GLOI}}$, a fifth input for receiving a first differential quadrature-phase signal $BB_Q$, a sixth input for receiving an inverse of the first differential in-phase signal $\overline{BB_Q}$, a seventh input for receiving an in-phase timing voltage signal $V_{GLOQ}$, an eighth input for receiving an inverse of the in-phase timing voltage signal $\overline{V_{GLOQ}}$, a first output and a second output, wherein the mixer is comprised of:

a seventh transistor, including a gate terminal for receiving $V_{GLOI}$, a first terminal for receiving $BB_I$, and a third terminal, wherein the third terminal of the seventh transistor is connected to the first output;

an eighth transistor, including a gate terminal for receiving $\overline{V_{GLOI}}$, a first terminal for receiving $BB_I$, and a third terminal;

a ninth transistor, including a gate terminal for receiving $\overline{V_{GLOI}}$, a first terminal for receiving $\overline{BB_I}$, and a third terminal, wherein the third terminal of the ninth transistor is connected to the first output;

a tenth transistor, including a gate terminal for receiving $V_{GLOI}$, a first terminal for receiving $\overline{BB_I}$, and a third terminal, wherein the third terminal of the tenth transistor is connected to the second terminal of the eighth transistor;

an eleventh transistor, including a gate terminal for receiving $V_{GLOQ}$, a first terminal for receiving $BB_Q$, and a third terminal, wherein the third terminal of the eleventh transistor is connected to the first output;

a twelfth transistor, including a gate terminal for receiving $\overline{V_{GLOQ}}$, a first terminal for receiving $BB_Q$, and a third terminal, wherein the third terminal of the twelfth transistor is connected to the second output;

a thirteenth transistor, including a gate terminal for receiving $\overline{V_{GLOQ}}$, a first terminal for receiving $\overline{BB_Q}$, and a third terminal, wherein the third terminal of the thirteenth transistor is connected to the first output; and a fourteenth transistor, including a gate terminal for receiving $V_{GLOQ}$, a first terminal for receiving $\overline{BB_Q}$, and a third terminal, wherein the third terminal of the fourteenth transistor is connected to the second terminal of the twelfth transistor.

18. A method, comprising:

multiplexing, by a multiplexer, a ground potential and a bias voltage, wherein the first multiplexer includes a first input for receiving the ground potential, a second input for receiving the bias voltage, a third input for receiving an enable signal, and an output;

transmitting, by a first transistor, a first differential modulated signal to a first inductor, wherein the first transistor includes a gate, a first terminal for receiving the first differential modulated signal, and a second terminal, and wherein the first inductor includes a first terminal and a second terminal, wherein the gate of the first transistor is connected to the output of the multiplexer, and wherein the first terminal of the first inductor is connected to the second terminal of the first transistor;

setting a capacitance value, by a first variable capacitor, wherein the first variable capacitance includes a first terminal, a second terminal, and an input for setting the capacitance value, wherein the first terminal of the first variable capacitor is connected to the second terminal of the first transistor, and wherein the second terminal of the first variable capacitor is connected to the second terminal of the first inductor;

transmitting, by a second transistor, a second differential modulated signal to the second terminal of the first inductor, wherein the second transistor includes a gate, a first terminal for receiving the second differential modulated signal, and a second terminal, wherein the gate of the second transistor is connected to the output of the multiplexer, and wherein the second terminal of the second transistor is connected to the second terminal of the first inductor;

mutually coupling a second inductor to the first inductor, wherein the second inductor includes a first terminal and a second terminal;

transmitting, by a balun-bias switch, a power supply voltage or the ground potential to the second terminal of the second inductor, wherein the balun-bias switch includes a first input for receiving the ground potential, a second input for receiving a power supply voltage, a third input for receiving an inverse of the enable signal, and an output, wherein the output of the balun-bias switch is connected to the second terminal of the second inductor;

coupling, by a second capacitor, a polar signal to the first terminal of the second inductor, wherein the second capacitor includes a first terminal connected to the first terminal of the second inductor, and a second terminal for receiving the polar signal, wherein the first terminal of the second capacitor is connected to the first terminal of the second inductor; and switching, by a port-switch, the first terminal of the second inductor to the output of the programmable matching network, wherein the port-switch includes a first input for receiving the enable signal, a second input for receiving the inverse of the enable signal, a third input, and an output, wherein the third input of the port-switch is connected to the first terminal of the second inductor.

19. The method of claim 18, wherein transmitting, by the balun-bias switch, the power supply voltage or the ground potential to the second terminal of the second inductor is comprised of transmitting, by the balun-bias switch, the power supply voltage or the ground potential to the second terminal of the second inductor, wherein the balun-switch is comprised of:

a third transistor, including a first terminal, a gate for receiving the inverse of the enable signal, and a second terminal, wherein the first terminal of the third transistor is connected to the second terminal of the second inductor, and wherein the second terminal of the third transistor is connected to the power supply voltage; and a fourth transistor, including a first terminal connected to the ground potential, a gate for receiving the inverse of the enable signal, and a second terminal connected to the second terminal of the second inductor, wherein the first terminal of the fourth transistor is connected to the ground potential, and wherein the second terminal of the fourth transistor is connected to the second terminal of the second inductor.

20. The method of claim 18, wherein switching, by the port-switch, the first terminal of the second inductor to the output of the programmable matching network is comprised of switching, by the port-switch, the first terminal of the second inductor to the output of the programmable matching network, wherein the port-switch is comprised of:
- a third capacitor, including a first terminal, and a second terminal, wherein the first terminal of the third capacitor is connected to the first terminal of the second inductor;
- a fifth transistor, including a first terminal, a gate for receiving the enable signal, and a second terminal, and wherein the first terminal of the fifth transistor is connected to the second terminal of the third capacitor; and
- a sixth transistor, including a first terminal, a gate for receiving the inverse of the enable signal, and a second terminal, wherein the first terminal of the sixth transistor is connected to the first terminal of the third capacitor, and wherein the second terminal of the sixth transistor is connected to the second terminal of the fifth transistor.

* * * * *